US006869807B2

(12) United States Patent
Yoshitake et al.

(10) Patent No.: US 6,869,807 B2
(45) Date of Patent: Mar. 22, 2005

(54) METHOD AND ITS APPARATUS FOR MANUFACTURING SEMICONDUCTOR DEVICE

(75) Inventors: Yasuhiro Yoshitake, Yokohama (JP); Kenji Tamaki, Yokohama (JP); Masahiro Watanabe, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 140 days.

(21) Appl. No.: 10/291,270

(22) Filed: Nov. 8, 2002

(65) Prior Publication Data

US 2003/0121022 A1 Jun. 26, 2003

(30) Foreign Application Priority Data

Nov. 8, 2001 (JP) ........................................ 2001-342949

(51) Int. Cl.[7] .......................... H01L 21/00; G06F 19/00
(52) U.S. Cl. ................................ 438/7; 438/5; 438/14; 438/16; 700/121
(58) Field of Search ............................ 438/5, 7, 14, 16; 700/44, 110, 121; 356/609; 382/145

(56) References Cited

U.S. PATENT DOCUMENTS

| 6,483,580 | B1 | * | 11/2002 | Xu et al. ..................... 356/300 |
| 6,617,087 | B1 | * | 9/2003 | Rangarajan et al. ........... 430/30 |
| 6,643,557 | B1 | * | 11/2003 | Miller et al. ................. 700/110 |
| 2002/0072001 | A1 | * | 6/2002 | Brown et al. .................. 430/30 |
| 2002/0177245 | A1 | * | 11/2002 | Sonderman et al. ........... 438/14 |
| 2003/0058443 | A1 | * | 3/2003 | Xu et al. ..................... 356/369 |

OTHER PUBLICATIONS

John Sturtevant, et al., "Implementation of a Closed–loop CD and Overlay Controller for Sub–0.25μm Patterning," *SPIE*, vol. 3332, pp. 461–470.

Xinhui Niu, "Specular Spectroscopic Scatterometry in DUV Lithography," *SPIE* (Mar. 1999) 3677:159–68.

M.G. Moharam, et al., "Diffraction Analysis of Dielectric Surface–relief Gratings," *J. Opt. Soc. Am.*, (Oct. 1982) 72(10):1385–92.

Y. Yoshitake, et al., "Multispot Scanning Exposure System for Excimer Laser Stepper," *SPIE* (Mar. 1991) 1463:678–87.

Nigel R. Farrar, et al., "In–situ Measurement of Lens Aberrations," *Optical Microlithography XIII, SPIE*, vol. 4000, pp. 18–29.

* cited by examiner

*Primary Examiner*—Matthew Smith
*Assistant Examiner*—Lex H. Malsawma
(74) *Attorney, Agent, or Firm*—Townsend and Townsend and Crew LLP

(57) ABSTRACT

Deviations from optimum values of the exposure light quantity and focus of test and product circuit patterns are predicted from the dimensions of the patterns, illumination conditions and the wave aberration of an exposure lens. A signal waveform of scatterometry of the test pattern is linked to the deviations from the optimum values of the exposure light quantity and focus to form a library. The test pattern after exposed and developed in actual steps is collated with the signal waveform in the library measured by the scatterometry to find deviations from the optimum values of the exposure light quantity and focus of the test pattern. Deviations of the optimum values of a product circuit pattern from the deviations of the test pattern are acquired on the basis of the deviations, and the acquired deviations are fed back to subsequent exposure steps.

16 Claims, 16 Drawing Sheets

METHOD AND ITS APPARATUS FOR MANUFACTURING SEMICONDUCTOR DEVICE

BACKGROUND OF THE INVENTION

The present invention relates to techniques for manufacturing a semiconductor device and more particularly, to a technique which is effectively applied to a method and its apparatuses for performing accurate control over the quantity of exposure light and focus in a light exposure step.

A semiconductor device is manufactured by iteratively executing, for each layer, a step of forming a conductive or insulating film on a wafer and a lithography step of applying resist as photosensitive agent on the film, exposes and develops a circuit pattern on a reticle on the resist and then etches the film with use of the residual resist as a mask to thereby form a circuit pattern on the wafer.

As a reference technique to the present invention, a light exposure step of printing a pattern on a photosensitive agent in an exposure step will be explained in connection with FIG. 19. A product circuit pattern region 50 of a reticle 5 has a circuit pattern 51 depicted thereon, and a test pattern 52 is provided outside of the region 50. Exposure light 4001 is used to transfer the circuit pattern on a photo-sensitive agent on a wafer 1 via an exposure lens 4. For the purpose of checking to determine if the transfer circuit pattern conforms to its dimensional specifications, its dimensional inspection is carried out usually by a scanning electron microscope (SEM). The inspection is carried out by directly measuring a transfer circuit pattern 151 or by measuring a transfer test pattern 152 present outside a chip region 150. Depending on the magnitude of the measured dimensions, correction is generally carried out with the quantity of exposure light in an exposure apparatus. Automation of the light quantity correction is described, e.g., in Implementation of a Closed-loop CD and Overlay Controller for sub 0.25 μm Patterning, SPIE Vol. 3332, 1998, pp. 461–470.

Meanwhile, the causes of the dimensional fluctuations include, in addition to fluctuations of the exposure light quantity in the exposure apparatus, a focus shift. A method for correcting not only the light exposure quantity but also the focus is disclosed, e.g., in U.S. Pat. No. 6,150,664. In this method, waveform changes in an SEM are previously associated with focus shifts to find a correction for the light exposure quantity and a correction for the focus.

A recent scatterometry method for optically measuring a sectional profile of a transfer circuit pattern is disclosed, e.g., in Specular Spectroscopic Scatterometry in DUV Lithography, SPIE Vol. 3677, 1999, pp. 159–168.

Explanation will now be made as to the arrangement of a scatterometry measuring apparatus by referring to FIGS. 20A and 20B. FIG. 20A shows a specular spectroscopic scatterometry measurement apparatus. White color light 2001 emitted from a white color light source 201 is irradiated on a repeated pattern 12 on a substrate 11 so that regularly-reflected light is spectrally separated by a diffraction grating 202 and detected by a sensor 203. Unlike the spectral type measurement apparatus for obtaining an optical intensity signal for wavelength, there is an incident angle change type which obtains a light intensity signal or signature for incident angle. In a measurement apparatus shown in FIG. 20B, an angle 9 of incident light 2002 is varied to irradiate the light on an object and to detect a regularly-reflected light 2003.

Explanation will next be made as to a method for processing a light intensity signal obtained in the above measurement apparatus with reference to FIG. 21. A light intensity signal 21 called a signature, when obtained in the measurement apparatus of FIG. 20A, indicates a light intensity change to wavelength. The signature varies with the sectional profile of the repeated pattern 12. Thus, signatures for various sectional profiles are previously found by wave optics simulation and stored in a library. For example, the sectional profiles are modeled in rectangle depending on a bottom line width L, film thickness D and taper angle α of the repeated pattern 12 to perform simulations over the signatures. The signature 21 is compared with the signatures in the library to find a coincided signature and to use a sectional profile providing the coincided signature, that is, a line width L1, film thickness D1 and taper angle α1 as measured values.

Scatterometry based on optical measurement is advantageous over the SEM because the reaction of the photosensitive agent may cause the line width to change during irradiation of electron beam in the SEM. Further, the scatterometry can measure in the atmosphere and, unlike the SEM requiring a time for evacuation, can measure at a higher speed.

As has been explained above, the scatterometry has a merit over the SEM in measurement of the circuit pattern sectional profile. However, the scatterometry requires previous calculation of a large number of waveforms and thus requires high-speed optical simulation. To this end, a calculation method called "Rigorous Couple Wave Analysis" and disclosed in Diffraction Analysis of Dielectric Surface-relief Gratings, J. Opt. Soc. Am., Vol. 72, No. 10, 1982, is employed. This is a method for approximating a pattern section as a plurality of rectangular layers, regarding the rectangular layers as endlessly-continuous diffraction gratings of an identical pitch and duty, and joining boundaries therebetween to determine a coefficient for the solution of a wave equation. When this method is compared with a finite element method or the like as another solution of the wave equation, waveform calculation can be carried out at a very high speed.

SUMMARY OF THE INVENTION

However, a pattern to be measured in the scatterometry is required to be made up of lines and spaces having an identical pitch and an identical duty in a range of several tens of μm as an illustration zone. In a product, only few of circuit patterns can satisfy the above requirements, and thus it is necessary to locate a test pattern (pattern for scatterometry measurement) outside the zone of the circuit pattern. As a result, it is impossible to monitor the quality of exposure light and focus using an actual product circuit pattern. Explanation will be made as to technical problems caused by the above fact in connection with FIG. 22.

Regions enclosed by solid and dotted lines in FIG. 22 show ranges of the exposure light quantity and focus where an on-specification line width falls within, e.g., ±10%. A rectangle 1010 inscribed in the region is called process window, and the quantity of exposure light and focus are set at a center 1021 of the process window. In this connection, there is a possibility that the center of the process window of the test pattern is different from that of the product circuit pattern, in which case, when the center 1021 of the process window of the test pattern is set as a control target, the control target is controlled at a point different from a center 1022 of the process window as the optimum condition of the product circuit pattern, being shifted from its dimensional specifications.

The present invention is directed to providing a semiconductor manufacturing method for controlling the quantity of exposure light and focus of a product circuit pattern to be shifted to respective optimum points while monitoring a test pattern.

It is an object of the present invention to provide a technique for manufacturing a semiconductor device which can eliminate the need for evacuating operation requiring a lot of time, can detect deviations from optimum values of the quantity of exposure light and focus of a product circuit pattern on the basis of an evaluation of a light exposure result of a test pattern or the like using scatterometry of light irradiation not having an idea of changing the sectional profile of a pattern to be examined, and can feed the detected deviations back to subsequent light exposure steps to thereby attain a high throughput and yield.

Novel features of the present invention will be apparent from the description of the present specification and the attached drawings.

A summary of typical ones of the inventions disclosed in the present application is as follows.

In accordance with an aspect of the present invention, there is provided a method for manufacturing a semiconductor device which includes the steps of:

forming a thin film on a substrate to be subjected to light exposure;

applying resist on the substrate;

exposing a product circuit pattern on an exposure original plate on the substrate having the resist applied thereon;

developing the exposed resist to form a pattern of the resist; and etching the substrate with use of the developed resist pattern as a mask to form a pattern of the thin film.

The light exposure step has:

a first step of previously acquiring differences in the quantity of exposure light and focus between the product circuit pattern within the exposure original plate and a test pattern;

a second step of linking a sectional shape of the test pattern or a signal waveform associated with the sectional shape to deviations from the optimum values of the exposure light quantity and focus and storing them as linked information;

a third step of measuring the sectional shape of the test pattern formed on the substrate through the light exposure step or the signal waveform associated with the sectional shape;

a fourth step of calculating deviations from optimum values of the exposure light quantity and focus of aid test pattern in the light exposure step on the basis of the sectional shape of the test pattern or the signal waveform associated with the sectional shape measured in the third step and on the basis of the linked information of the second step;

a fifth step of calculating deviations from the optimum values of the exposure light quantity and focus of the product circuit pattern on the basis of the deviations from the optimum values of the exposure light quantity and focus relating to the test pattern obtained in the fourth step and on the basis of the differences in the optimum values of the exposure light quantity and focus between the product circuit pattern and the test pattern obtained in the first step; and a sixth step of feeding the deviations from the optimum values of the exposure light quantity and focus of the product circuit pattern calculated in the fifth step back to the light exposure step.

With the above arrangement, since the deviations from the optimum values of the exposure light quantity and focus of the product circuit pattern can be found based on the measured data of the test pattern, the exposure light quantity and focus of a fine device having a narrow margin can be controlled at the same time with an improved yield.

As the product circuit pattern, further, a pattern having the strictest exposure light quantity and focus tolerances or margins to dimensional specifications within the exposure original plate can be selected. As a result, since optimum values are found to a pattern providing the highest yield, the yield can be improved over a yield when a product circuit pattern in another region is used.

As the signal waveform, a change in the reflected light intensity of the test pattern with respect to the wavelength or incident angle of illumination light can be used. When compared with the SEM or the like case using a signal waveform, this method can eliminate the need for evacuating operation and can increase a throughput acquired by the signal waveform. In addition, in the case of the SEM, irradiation of an electron beam may cause a change of the sectional profile of a pattern to be measured; whereas, in the case of the light irradiation, there is almost no such a danger of damage caused by such measurement.

In the first step of previously acquiring differences from the optimum values of the exposure light quantity and focus between the product circuit and test patterns within the exposure original plate, the differences from the optimum values can be calculated with use of the dimensions of the product circuit pattern and test pattern, illumination conditions at the time of light exposure, and the wave aberration of an exposure apparatus corresponding to positions of the product circuit and test patterns within the original plate. As a result, since the differences between the optimum values of the product circuit pattern and test pattern can be calculated not by experiment but by simulation, necessary data can be quickly obtained.

Further, in the second step of linking the sectional shape of the test pattern or the signal waveform associated with the sectional shape to the deviations from the optimum values of the exposure light quantity and focus and storing them as the linked information, the sectional profile of the test pattern and the signal waveform thereof can be calculated with use of the dimensions of the test pattern, illumination conditions at the time of light exposure, and the wave aberration of an exposure apparatus corresponding to a position of the test pattern within the original plate, and thus the linked information can be generated. With the above arrangement, if a plurality of exposure apparatuses are provided, then respective signal wave-form libraries (linked information) can be calculated from the wave aberrations of the exposure apparatuses, the need for performing a light exposure test for each exposure apparatus can be eliminated.

Furthermore, the second step of linking the sectional shape of the test pattern or the signal waveform associated with the sectional shape to the deviations from the optimum values of the exposure light quantity and focus and storing them as the linked information, may include:

a step of preparing a focus exposure matrix (FEM) wafer having a plurality of the aforementioned test patterns formed thereon by exposing (shotting) the test patterns while stepwise changing the quantity of exposure light and focus;

a step of measuring respective sectional profiles of the plurality of test patterns (shots) formed on the FEM wafer;

a step of generating a sectional profile model from the sectional profiles; and a step of calculating a signal waveform with a pitch of the exposure light quantity and focus smaller than a gap between the plurality of test patterns formed on the FEM wafer with use of the sectional profile model.

With the above arrangement, since a signal waveform library smaller than the pitch of the exposure light quantity and focus of the FEM wafer can be obtained, deviations from the optimum values of the exposure light quantity and focus associated with an actually measured signal waveform can be found more accurately.

In accordance with another aspect of the present invention, there is provided a semiconductor device manufacturing system for forming a product circuit pattern on a substrate to be subjected to light exposure by lithography, which includes:

an exposure apparatus for exposing a product circuit pattern of an exposure original plate on the substrate;

a scatterometry apparatus having a light source for irradiating light on a subject to be examined and a sensor for detecting light passed through the subject as a signal waveform, for measuring the signal waveform according to the surface shape of the subject;

a history memory unit for storing a history of the exposure apparatus used in manufacturing of the substrate, illumination conditions and the exposure original plate;

an original plate data memory unit for storing dimensions of the product circuit pattern of the exposure original plate, dimensions of the test pattern, coordinates of the product circuit pattern and coordinates of the test pattern;

an illumination conditions memory unit for storing illumination conditions for the each exposure apparatus and each step;

a wave aberration data memory unit for storing wave aberration data for the each exposure apparatus and each pattern coordinate;

a pattern optimum value deviation calculation unit for calculating deviations from optimum values of the exposure light quantity and focus of the test pattern and the product circuit pattern from the illumination conditions, the dimensions of the product circuit pattern and test pattern, and the wave aberration for the each coordinate;

a pattern optimum value deviation memory unit for storing the optimum value deviations;

an FEM-linked library signal waveform memory unit for storing deviations from the optimum values of the exposure light quantity and focus and a signal waveform associated with the sectional shape of the test pattern as linked to the deviations;

a waveform matching unit for calculating deviations from the optimum values of the exposure light quantity and focus of the test pattern by extracting most matched one of the signal waveforms stored in the FEM-linked library signal waveform memory unit with respect to the test pattern signal waveform of the substrate actually measured by the scatterometry apparatus;

a correction calculation unit for calculating a correction of the exposure apparatus to the product circuit pattern from the deviations from the optimum values of the exposure light quantity and focus of the test pattern calculated by the waveform matching unit and from the optimum value deviations of the test pattern and the product circuit pattern stored in the pattern optimum value deviation memory unit; and a control unit for controlling the each unit, the scatterometry apparatus and data input/output between the exposure apparatuses.

At the time of manufacturing a semiconductor device, this system instantaneously searches for the deviations of the optimum exposure values of the test pattern and product circuit pattern by referring to lot history data, the system can quickly perform correction feedback of the exposure light quantity and focus to the exposure apparatuses.

These and other subjects, features and advantages of the invention will be apparent from the following more particular description of preferred embodiments of the invention, as illustrated in the accompanying drawings.

DETAILED DESCRIPTION OF THE EMBODIMENTS

Embodiments of the present invention will be detailed with reference to the attached drawings.

Figure 1:
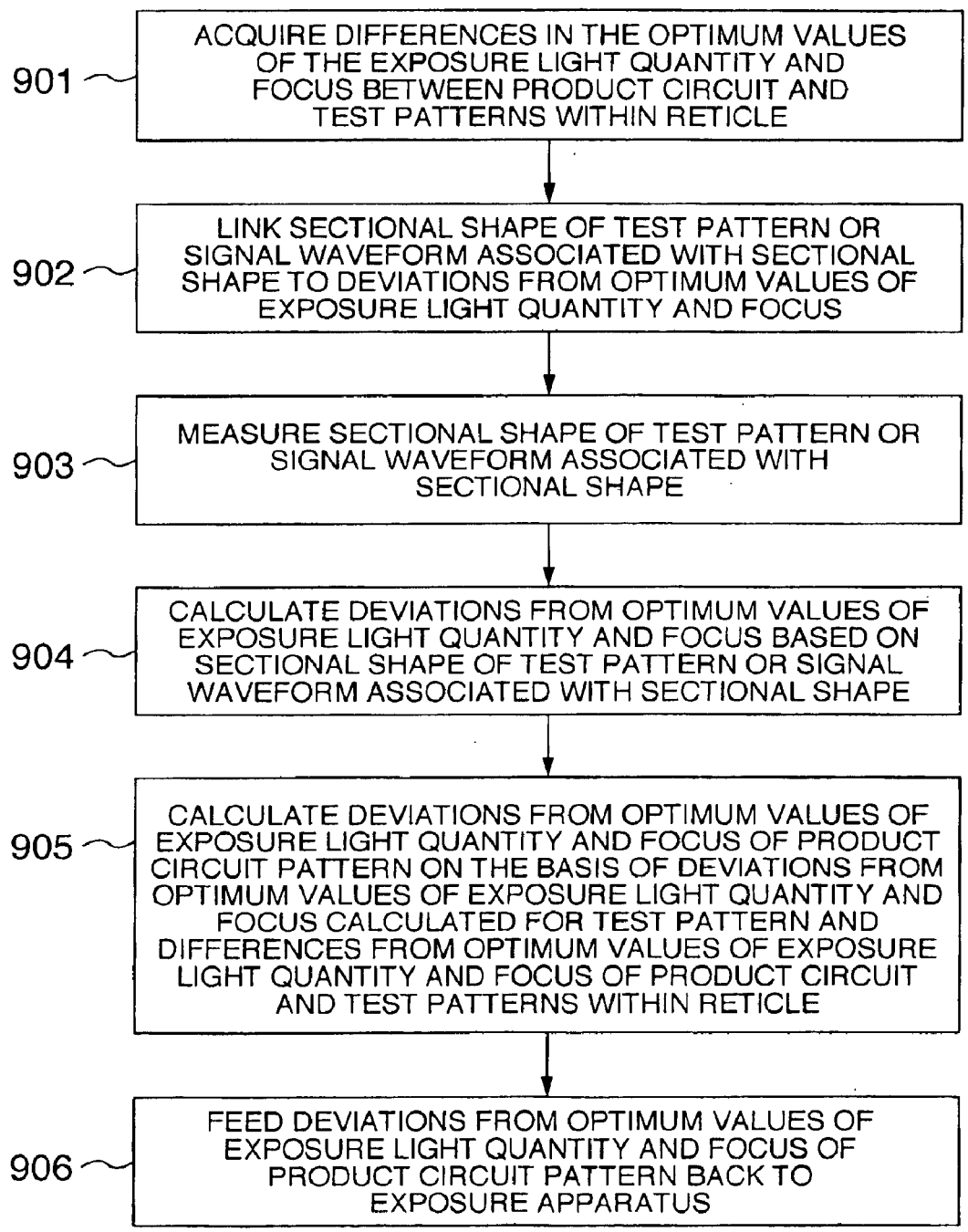
FIG. 1 is a flowchart showing an example of a method for manufacturing a semiconductor device as an embodiment of the present invention.

FIG. 1 is a flowchart showing an example of a method for manufacturing a semiconductor device as an embodiment of the present invention.

In a step 901, first of all, differences in the optimum values of the exposure light quantity and focus between a circuit pattern 51 and a test pattern 52 within a reticle 5 are previously acquired. For example, differences between the optimum values of the exposure light quantity and focus when a central dimension was specified within ±10% are given as a center offset of a process window as mentioned above. According to experimental one of methods for finding the differences, light exposure is carried out while the exposure light quantity and focus are varied to measure dimensions of transfer patterns of the circuit and test patterns 51 and 52, their process windows are plotted, and their center offsets are calculated. In this method, however, since the experiment takes a lot of time, this method may not commensurate with its cost when it is used for many types and a small quantity of production.

In another method, the transfer line width of a circuit pattern is calculated by transfer image simulation and the center offset of a process window is predicted.

Explanation will now be made as how to calculate a transfer image by referring to FIG. 2. In order to calculate a transfer image of a circuit pattern to be examined to a wafer 1, first, illumination conditions 2100, a circuit pattern 500 on the reticle 5, and data on the wave aberration 400 of an exposure lens 4 are required. How to calculate an image using these data is disclosed in, for example, the aforementioned 'Y. Yoshitake et al. SPIE Vol. 1463, pp. 678–679, 1991'.

Figure 3A:
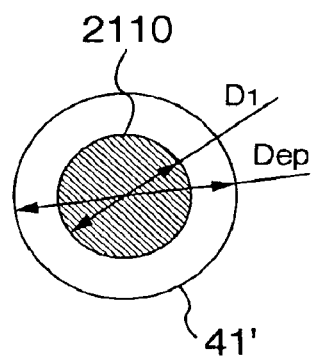
FIGS. 3A to 3C show conceptual views for explaining illumination conditions as an example of parameters used to find differences of optimum values of the exposure light quantity and focus of the test pattern and product circuit pattern in the method for manufacturing a semiconductor device as the embodiment of the present invention.
Figure 3B:
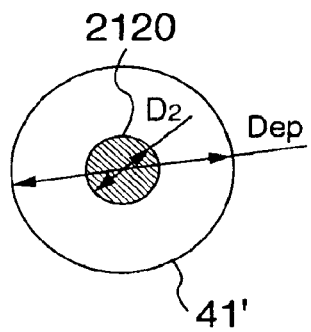
Figure 3C:
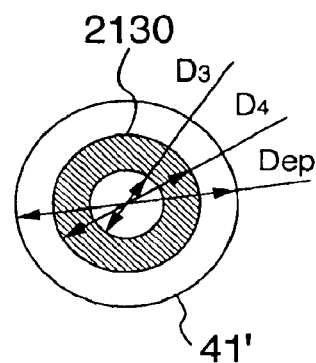

Now a specific example of the illumination conditions 2100 will be explained with reference to FIGS. 3A to 3C. FIG. 3A shows a case of general illumination, wherein an illumination light source image 2110 has a diameter D1 and an image 41' of a diaphragm 41 of an exposure lens 4 has a diameter Dep as parameters. FIG. 3B shows illumination conditions (small σ illumination) used when a circuit pattern 500 has phase information in addition to white and black information, that is, when a phase shift reticle is used, wherein a ratio of a diameter D2 of an illumination light source image 2120 to the diameter Dep is smaller than that in FIG. 3A. FIG. 3C shows a case of so-called annular illumination, wherein an illumination light source image 2130 has an inner diameter D4 and an outer diameter D3.

Figure 4:
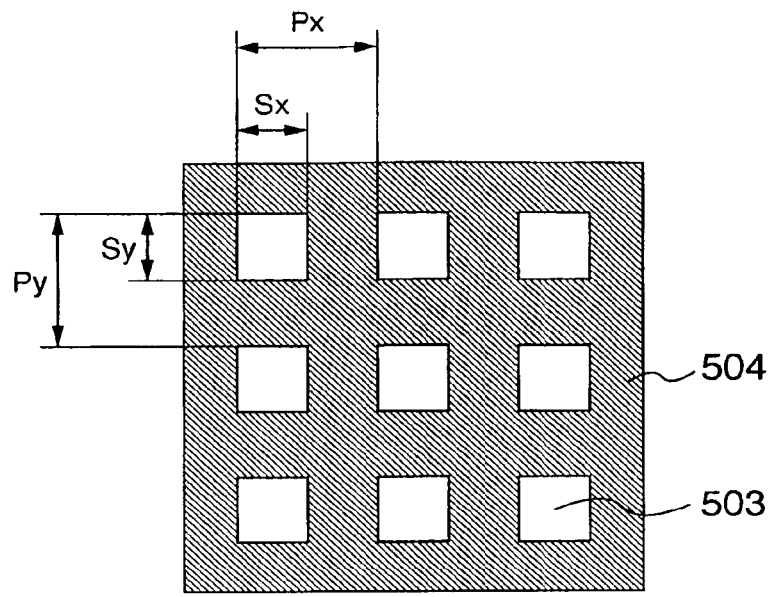
FIG. 4 is a conceptual view for explaining the product circuit pattern as an example of parameters used to find differences of optimum values of the exposure light quantity and focus of the test pattern and product circuit pattern in the method for manufacturing a semiconductor device as the embodiment of the present invention.

Explanation will next be made as to a specific example of the circuit pattern 500 in FIG. 2 by referring to FIG. 4. FIG. 4 sows an example of a hole pattern which is made up of light shielding parts 504 and openings 503. The openings are arranged in an X direction with an opening width Sx and a pitch Px, while the openings are arranged in a Y direction with an opening width Sy and a pitch Py.

Figure 5A:
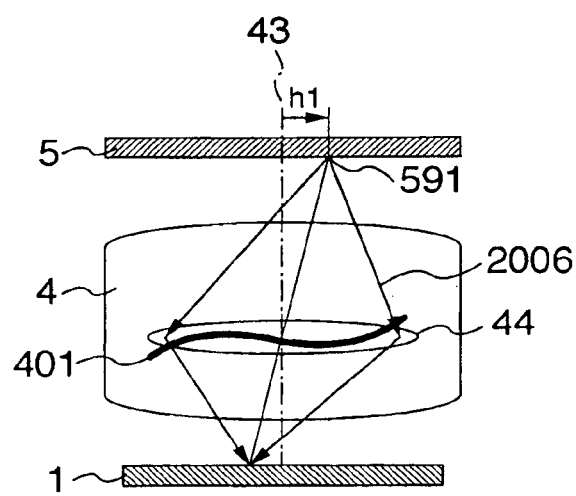
FIGS. 5A and 5B are conceptual views for explaining a difference in generation of wave aberration by coordinates on a reticle when differences between the optimum values of the exposure light quantity and focus in the method for manufacturing a semiconductor device as the embodiment of the present invention.
Figure 5B:
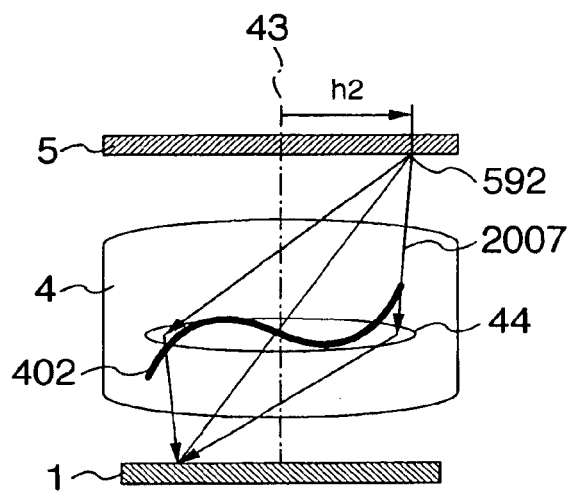

The reason why wave aberrations in the X and Y directions are different in pattern coordinates will now be explained with use of FIGS. 5A and 5B. In FIG. 5A, light 2006 emitted from a point 591 of a reticle 5 is passed through an exposure lens 4 and imaged on a wafer 1. The point 591 is located at a coordinate position spaced by hi from the center 43 of the lens. In FIG. 5B, light 2007 emitted from a point 592 of the reticle 5 is passed through the exposure lens 4 and imaged on the wafer 1. The point 592 is located at a coordinate position spaced by h2 from the lens center 43. Since beams 2006 and 2007 have different incident angles to an element lens 44 within the exposure lens 4, different wave aberrations 401 and 402 are generated.

Figure 2:
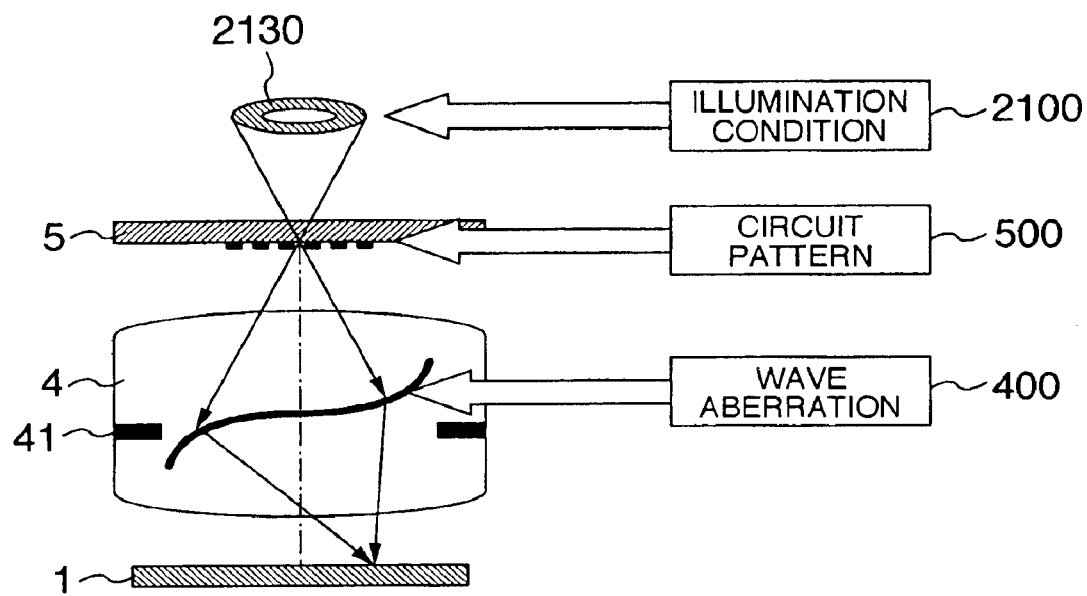
FIG. 2 is a conceptual view for explaining an example of parameters used to find differences of optimum values of the exposure light quantity and focus of a test pattern and a product circuit pattern in the method for manufacturing a semiconductor device as the embodiment of the present invention.
Figure 6:
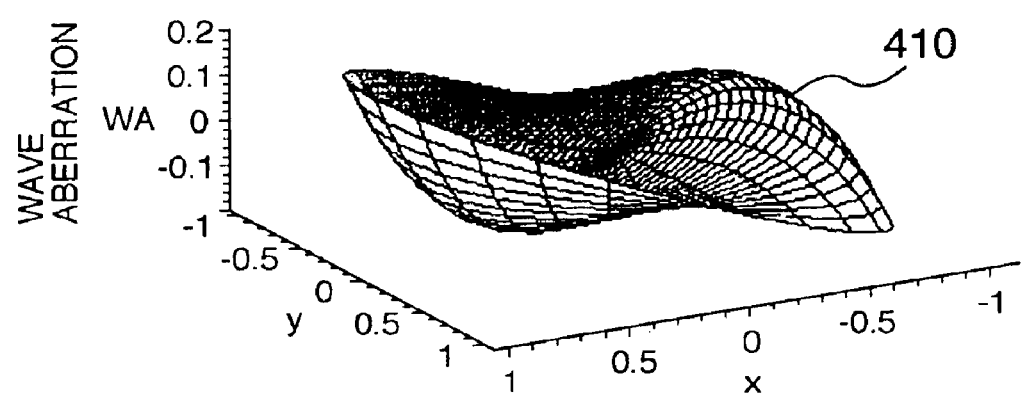
FIG. 6 is a conceptual view for explaining an exemplary distribution of wave aberration as an example of parameter used to find differences between the optimum values of the exposure light quantity and focus of the test and product circuit patterns in the method for manufacturing a semiconductor device as the embodiment of the present invention.
Figure 7:
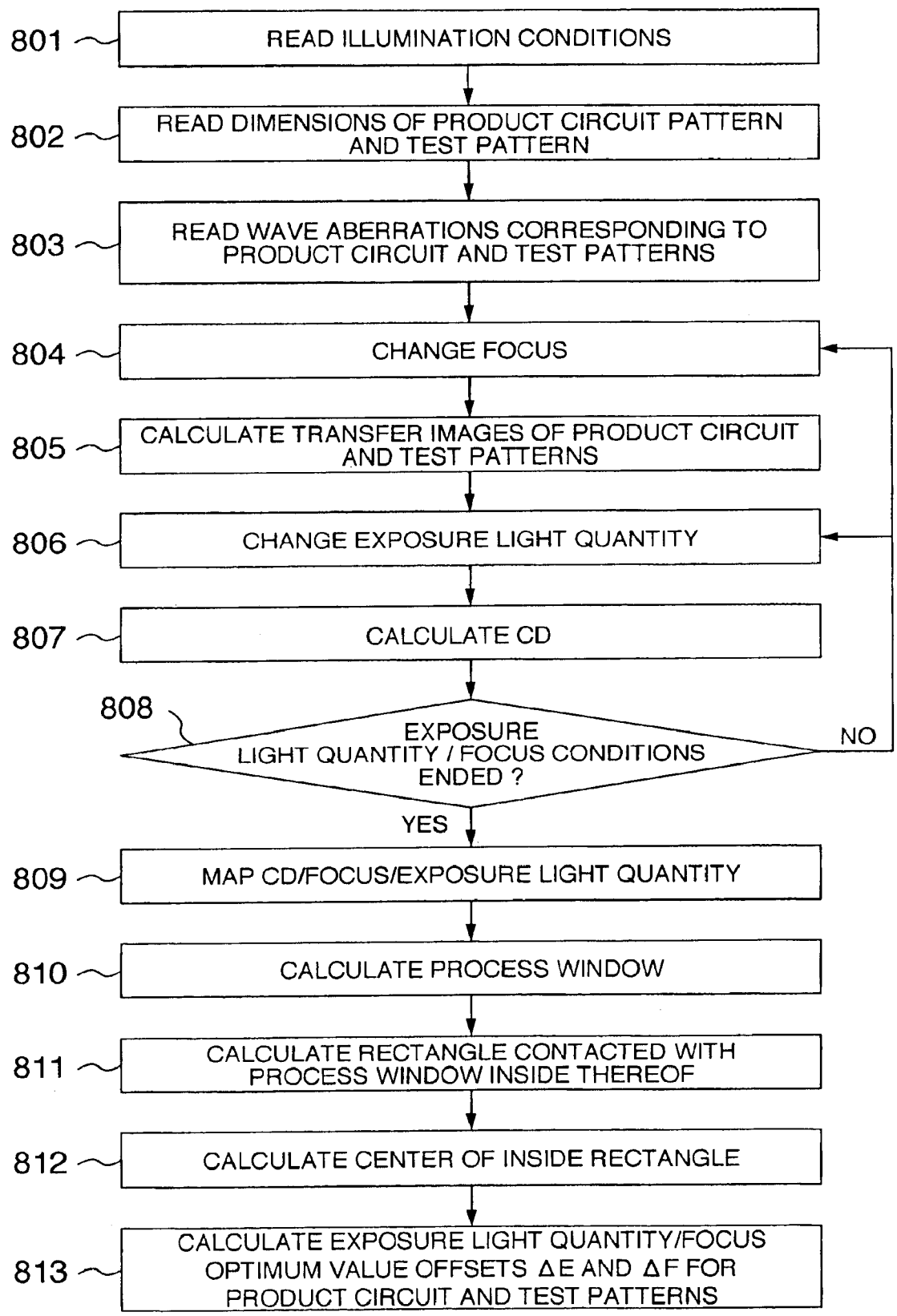
FIG. 7 is a flowchart showing an example of processing to find the optimum values of the exposure light quantity and focus of the test and product circuit patterns in the method for manufacturing a semiconductor device as the embodiment of the present invention.

Shown in FIG. 6 is an example of the wave aberration 400 in FIG. 2. A wave aberration 410 is an example of coma aberration which is asymmetrical with respect to an X direction and is 3-dimensional data. The wave aberration 410 can be measured for each coordinate point from the center of the exposure light, e.g., by a method described in "N. R. Farrar et al, SPIE Vol. 4000, pp. 19–22, 2000".

Explanation will now be made as to a specific method for finding differences between optimum values of the exposure light quantity and focus of the circuit and test patterns 51 and 52 within the reticle 5 in the step 901 of FIG. 1.

First, illumination conditions are read in in a step 801, dimensions of product circuit and test patterns are read in in a step 802, wave aberrations corresponding to coordinates of the product circuit and test patterns are read in in a step 803. A focus value is set in a next step 804, and transfer images of the product circuit and test patterns are calculated in the aforementioned manner in a step 805. Next, the quantity of exposure light is set in a step 806, and critical dimensions CD as the dimensions of the product circuit and test patterns are calculated in a step 807.

Figure 8:
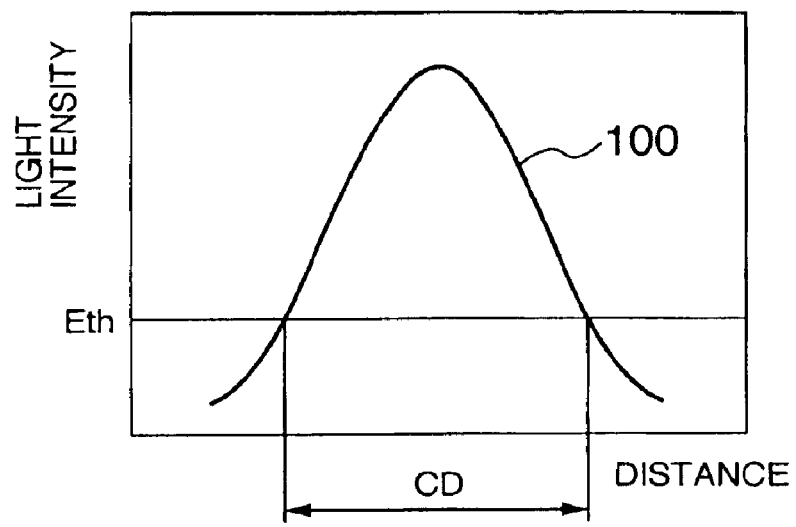
FIG. 8 is a conceptual view for explaining how to find a line width (CD) from a transfer image light intensity distribution in the processing of finding differences between the optimum values of the exposure light quantity and focus of the test and product circuit patterns in the method for manufacturing a semiconductor device as the embodiment of the present invention.

Explanation will now be made as to how to calculate the dimensions CD by referring to FIG. 8. Dimensions CD after developed are found by giving a threshold value Eth of the quantity of exposure light to a light intensity distribution 100 of the transfer images calculated in the step 805.

Figure 9:
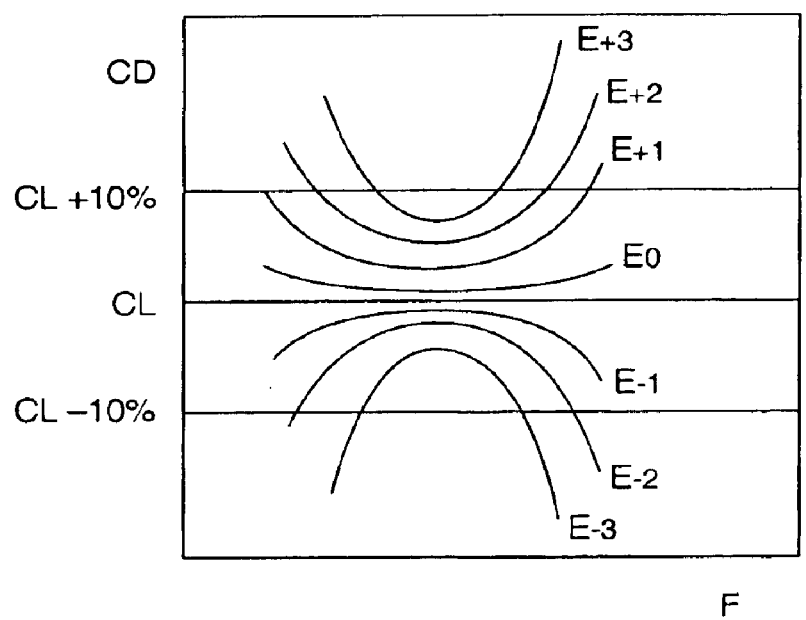
FIG. 9 is a diagram plotting contour lines in a plane showing focus and line width in the processing of finding differences between the optimum values of the exposure light quantity and focus of the test and product circuit patterns in the method for manufacturing a semiconductor device as the embodiment of the present invention.
Figure 10:
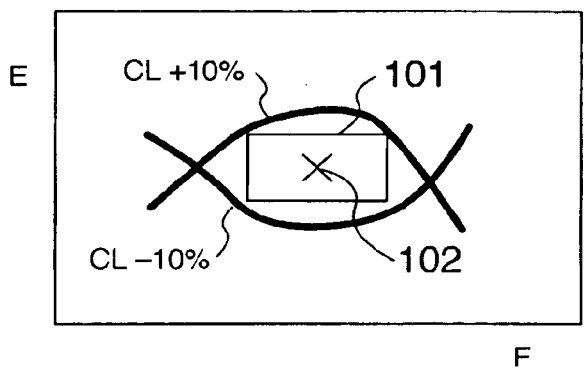
FIG. 10 is a diagram for explaining a process window in the processing of finding differences between the optimum values of the exposure light quantity and focus of the test and product circuit patterns in the method for manufacturing a semiconductor device as the embodiment of the present invention.

Next, it is examined in a step 808 whether or not adjustment of the exposure light quantity and focus to each of the set quantity have been completed. When the exposure light quantity adjustment is not completed, control goes to the step 806; whereas, when the focus adjustment is not completed, control returns to the step 804. When all the conditions have been completed, a relation between the dimensions CD, focus and exposure light quantity is mapped in a step 809. An example of mapping is shown in FIG. 9. In the drawing, abscissa denotes focus F, ordinate denotes dimension CD, and a relation between the focus F and dimension CD is plotted with respect to each exposure light quantity E. In the same drawing, CL denotes an on-specification center of the dimension CD, CL+10% denotes the dimensions CD increased by +10% from the on-specification center CL, and CL−10% denotes the dimension CD increased by −10% from the on-specification center CL. Relations between the exposure light quantity E and focus F providing respective dimensions CD's can be plotted by lines crossing the lines CL+10% and CL−10%. Such a condition is shown in FIG. 10. In the drawing, a region enclosed by the lines CL+10% and CL−10% is a so-called process window.

Such a process window as shown in FIG. 10 is found in a step 810, a rectangle 101 contacted with the process window inside thereof in a step 311, and a center 102 of the rectangle 101 is found in a step 812. In a step 813, the center 102 of the rectangle 101 is found for each product circuit pattern and each test pattern, and differences ΔE, ΔF therebetween are calculated as optimum value offsets of the exposure light quantity and focus.

The specific calculation method in the step 901 in FIG. 1 has been explained above. Explanation will now be directed to the description of the embodiment of the present invention by referring back to FIG. 1.

Figure 11:
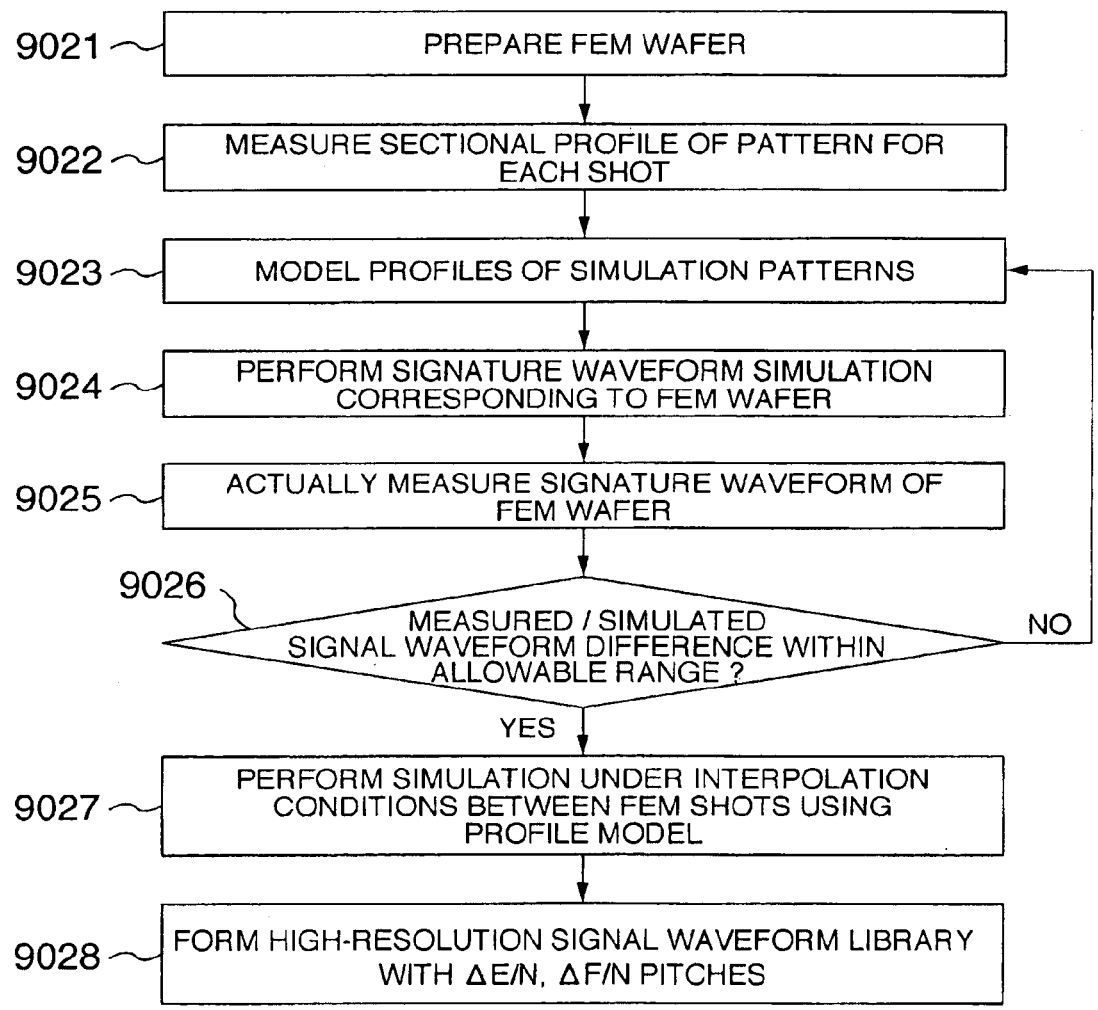
FIG. 11 is a flowchart showing an example of generating a signal waveform library relating to the test pattern in the method for manufacturing a semiconductor device as the embodiment of the present invention.

In a step 902, the sectional shape of the test pattern or a signal waveform associated with the sectional shape is linked to deviations to optimum values of the exposure light quantity and focus. The specific contents of this operation will now be explained with reference to a flowchart of FIG. 11.

Figure 12:
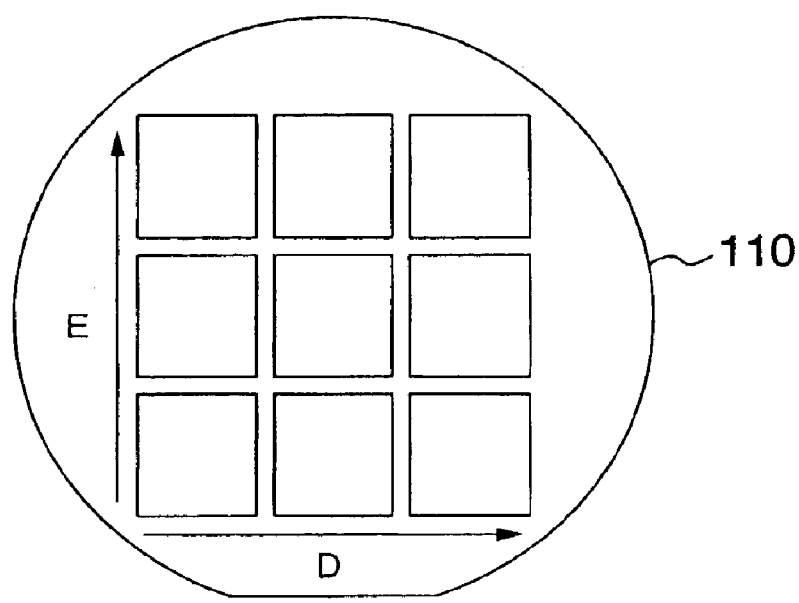
FIG. 12 is a plan view for explaining an FEM wafer used in generating the signal waveform library relating to the test pattern in the method for manufacturing a semiconductor device as the embodiment of the present invention.
Figure 13:
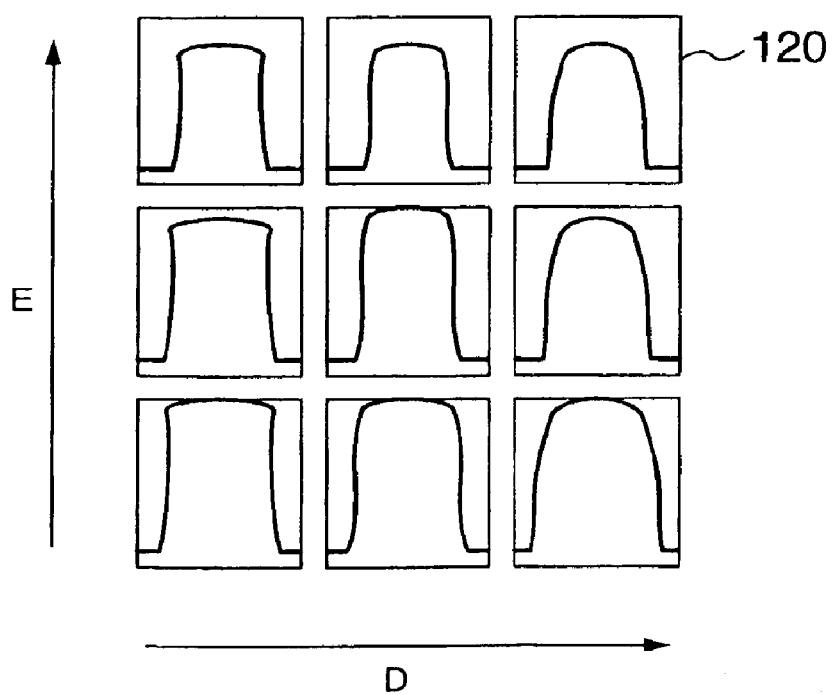
FIG. 13 is a diagram for explaining the pattern sectional profile of each shot of the FEM wafer used in generating the signal waveform library relating to the test pattern in the method for manufacturing a semiconductor device as the embodiment of the present invention.
Figure 14:
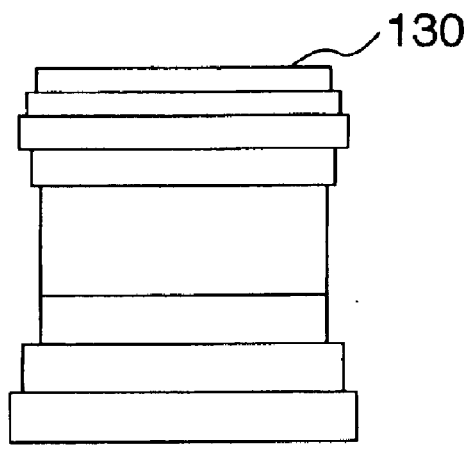
FIG. 14 is a conceptual view for explaining how to model the pattern sectional profile used in generating the signal waveform library relating to the test pattern in the method for manufacturing a semiconductor device as the embodiment of the present invention.
Figure 15:
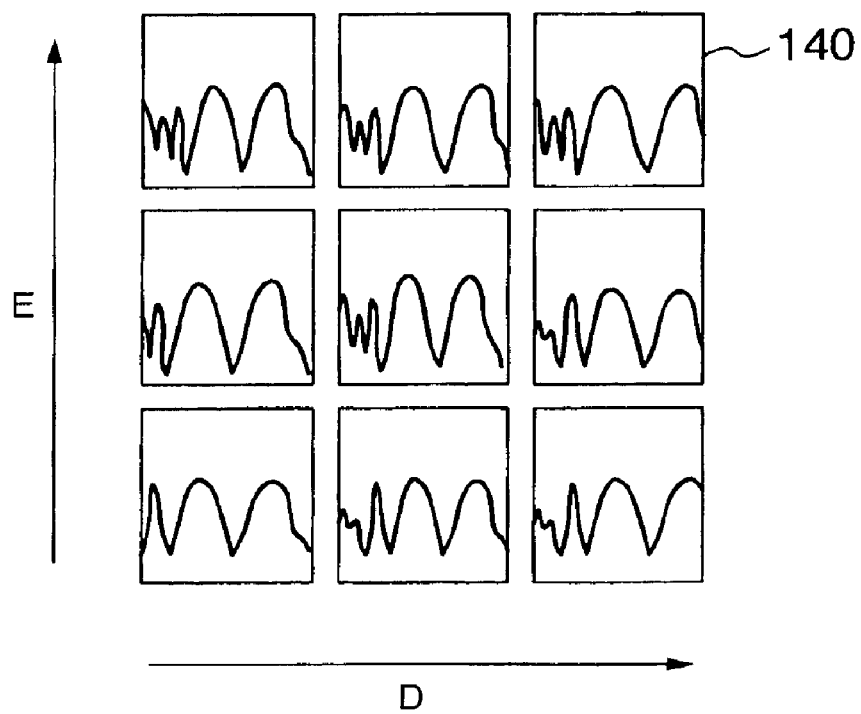
FIG. 15 is a diagram for explaining a signal waveform associated with each shot of the FEM wafer used in generating the signal waveform library relating to the test pattern in the method for manufacturing a semiconductor device as the embodiment of the present invention.

First, a focus exposure matrix (FEM) wafer is prepared in a step 9021. An FEM wafer 119, as shown in FIG. 12, is a wafer exposed by changing the focus D by ΔD in a column direction and the exposure light quantity E by ΔE in a row direction. In a next step 9022, the sectional profile of a pattern for each shot is measured, e.g., by an atomic force microscope (AFM). FIG. 13 shows a sectional profile 120 for each shot. In a step 9023, further, a pattern profile for simulation is modeled from actually-measured sectional profiles of FIG. 13. A profile model 130 for simulation is defined, as shown in FIG. 14, by stacking rectangular patterns. In a next step 9024, signature waveform simulation is carried out with use of a profile model associated with each shot of the FEM wafer 110. FIG. 15 shows a matrix 140 of signature waveforms corresponding to an FEM. In a next step 9025, the FEM wafer is measured for each shot by the scatterometry apparatus to obtain a matrix of actually measured signature waveforms. In a step 9026, further, a difference between an actually measured signature waveform and a signature waveform for simulation is calculated for each shot. When the difference is smaller than a preset allowance value, the system regards it as the accuracy of the profile modeling in the step 9023 being sufficient and proceeds to a step 9027. When the difference is larger than the allowance value, the system returns to the step 9023 and again performs modeling operation. A difference ΔS between signature waveforms actually measured and for simulation is found, e.g., by the following equation (1).

$$\Delta S = \sqrt{\frac{1}{N} \sum_{i=1}^{N} \{f(i) - g(i)\}^2} \quad (1)$$

Wherein, N denotes the number of points for signal waveform data, i denotes a signal waveform point position, f(i) denotes actually-measured signal wave-form data, and g(i) denotes simulation signal waveform data.

Figure 16:
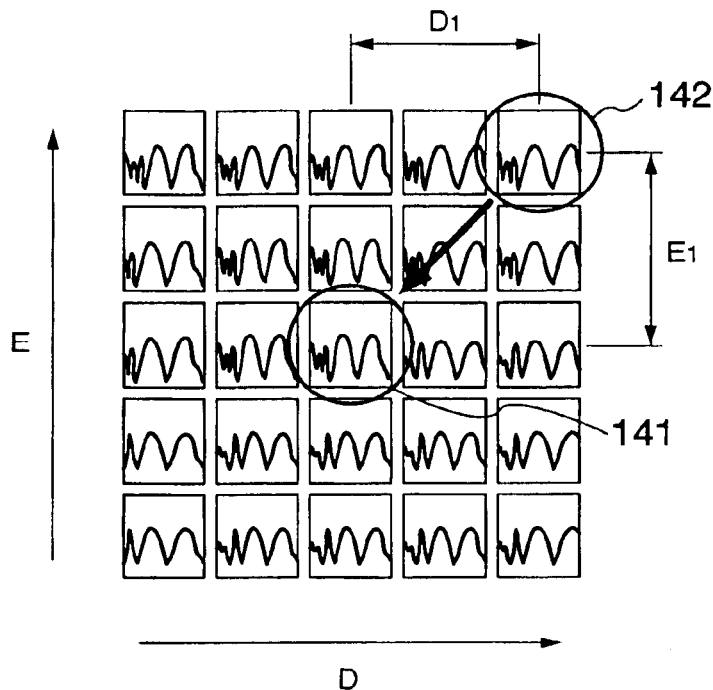
FIG. 16 is a diagram for explaining a library signal waveform relating to the test pattern in the method for manufacturing a semiconductor device as the embodiment of the present invention.

In a step 9027, the FEM wafer is simulated with use of the profile model 130 and with a small exposure light quantity focus pitch, ΔE/N and ΔD/N. In a step 9028, a library of signature waveforms associated with the exposure light quantity and focus is prepared. In this case, N denotes an integer of, e.g., 2 or more and indicates the number of interpolation points between FEM wafer shots. FIG. 16 shows an example of the signature waveform library.

The specific operations of the step 902 in FIG. 1 have been explained above.

In a next step 903 of FIG. 1, a sectional shape of the test pattern or a signal waveform associated with the sectional shape is measured by a scatterometry technique.

In a step 904, further, deviations between the exposure light quantity and focus with respect to the optimum values of the exposure light quantity and focus are found from the signal waveform. In the library signal waveforms of FIG. 16 and the signal waveform actually measured in the step 903, the deviations are found by selecting one of the library signal waveforms having a minimum sum of squares of a difference between wavelengths or incident angles and using the optimum values of the exposure light quantity and focus of the FEM associated therewith. This will be explained with use of FIG. 16. Assuming that a difference between a library signal waveform 141 when the exposure light quantity and focus are optimum and the actually-measured signal waveform became a minimum at a library signal waveform 142, then differences E1 and D1 in matrix coordinates between the two library signal waveforms become deviations from the optimum values of the exposure light quantity and focus respectively.

In a step 905, deviations from the optimum values of the product circuit pattern are calculated on the basis of the differences between the optimum values of the product circuit and test patterns found in the step 901 and on the basis of the deviations from the optimum values of the test pattern obtained from the signal waveform of the test pattern found in the step 904. Finally, in a step 906, the deviations calculated in the step 905 are fed as corrections of the exposure light quantity and focus back to the exposure apparatus at the time of the next exposure.

The deviations of the exposure light quantity and focus have been calculated based on the signal waveforms measured by the scatterometry apparatus in the description of the embodiment in connection with FIG. 1. However, the deviations may be calculated based on the sectional shape waveforms measured by the AFM or the like.

In the foregoing embodiment, the signal wave-form library for the test pattern has been prepared. However, if signal waveforms for each shot of the FEM wafer vary in such an extent that the waveforms can be sufficiently distinguished from each other in the product circuit pattern, then actually-measured signal waveforms for each shot of the FEM wafer may be used as a library. In this case, the processing flow of FIG. 1 is simplified into such a processing flow as shown in FIG. 17.

Figure 17:
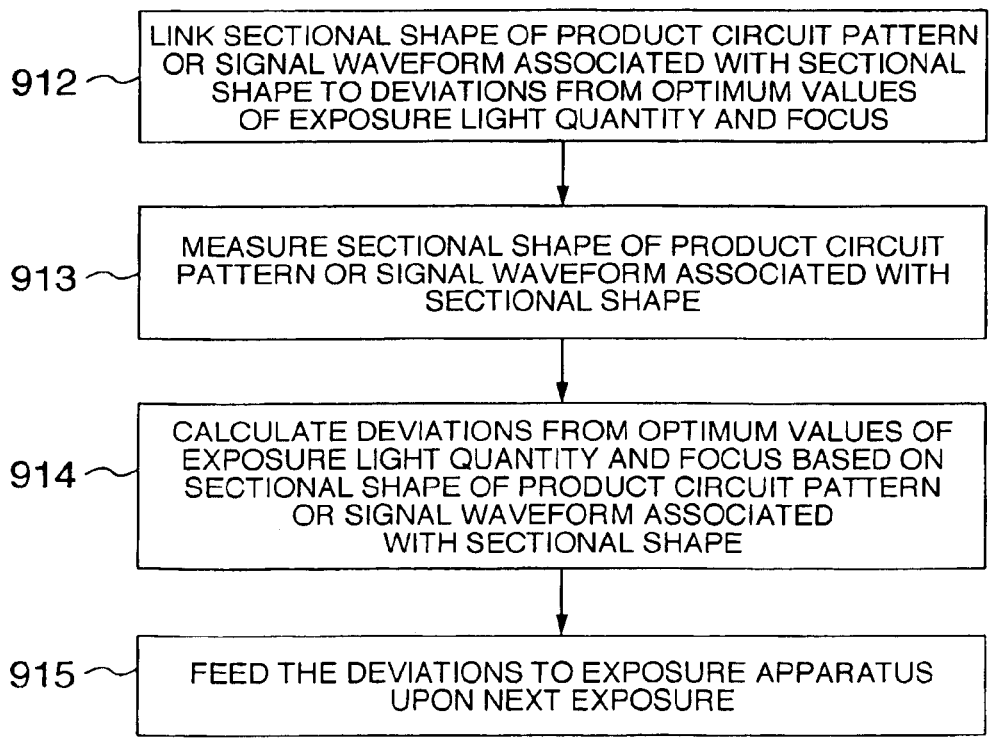
FIG. 17 is a flowchart showing an example of processing to correct the exposure light quantity and focus of an exposure apparatus with use of the product circuit pattern itself in the method for manufacturing a semiconductor device as the embodiment of the present invention.

More specifically, first, in a step 912 of FIG. 17, sectional shapes of the product circuit pattern or signal waveforms associated with the sectional shapes are linked to deviations from the optimum values of the exposure light quantity and focus. As has been explained above, this corresponds to preparation of a signal waveform library associated with the FEM wafer for the product circuit pattern. In a next step 913, sectional shapes of the product circuit pattern or signal waveforms associated with the sectional shapes are measured. In a next step 914, matching operation is carried out between the sectional shapes of the product circuit pattern or the signal waveforms associated with the sectional shapes and the aforementioned signal waveform library to find deviations from the optimum values of the exposure light quantity and focus from the corresponding signal waveform library. In a step 915, finally, the deviations are fed back as they are as corrections of the exposure apparatus at the time of the next exposure. As the signal waveforms of the product circuit pattern, signal waveforms measured by the scatterometry apparatus or sectional profile signal waveforms obtained by measuring typical one of product circuit patterns by the AFM may be used.

This can be applied to a case where signal waveforms of a product circuit pattern vary sensitively to the exposure light quantity and focus, in which case the monitoring of the test pattern and the creation of the signal waveform library can be omitted and thus the processing can be quickly advanced to a large extent.

Figure 18:
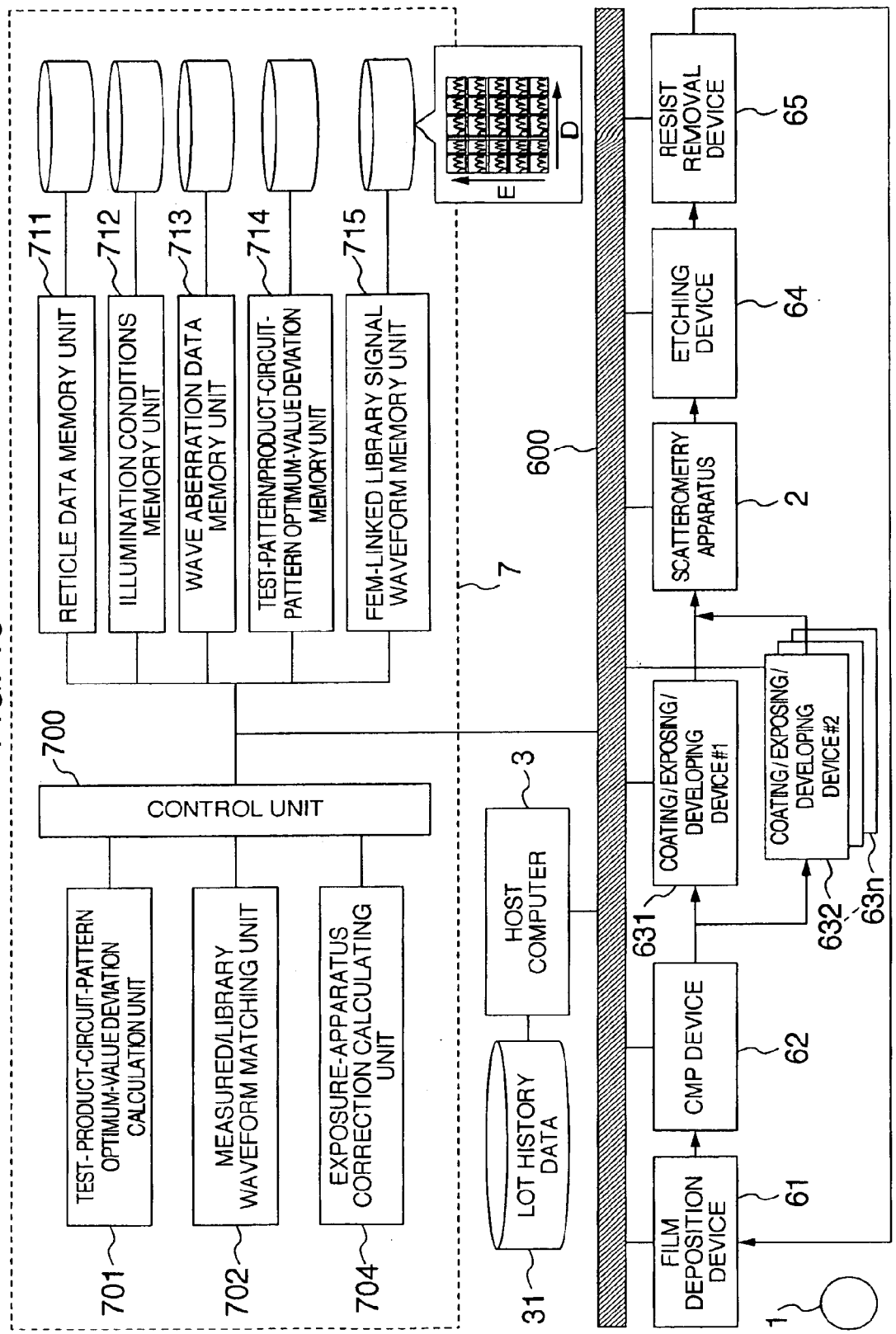
FIG. 18 is a conceptual view showing an example of an arrangement of a system for manufacturing a semiconductor device as an embodiment of the present invention.
Figure 19:
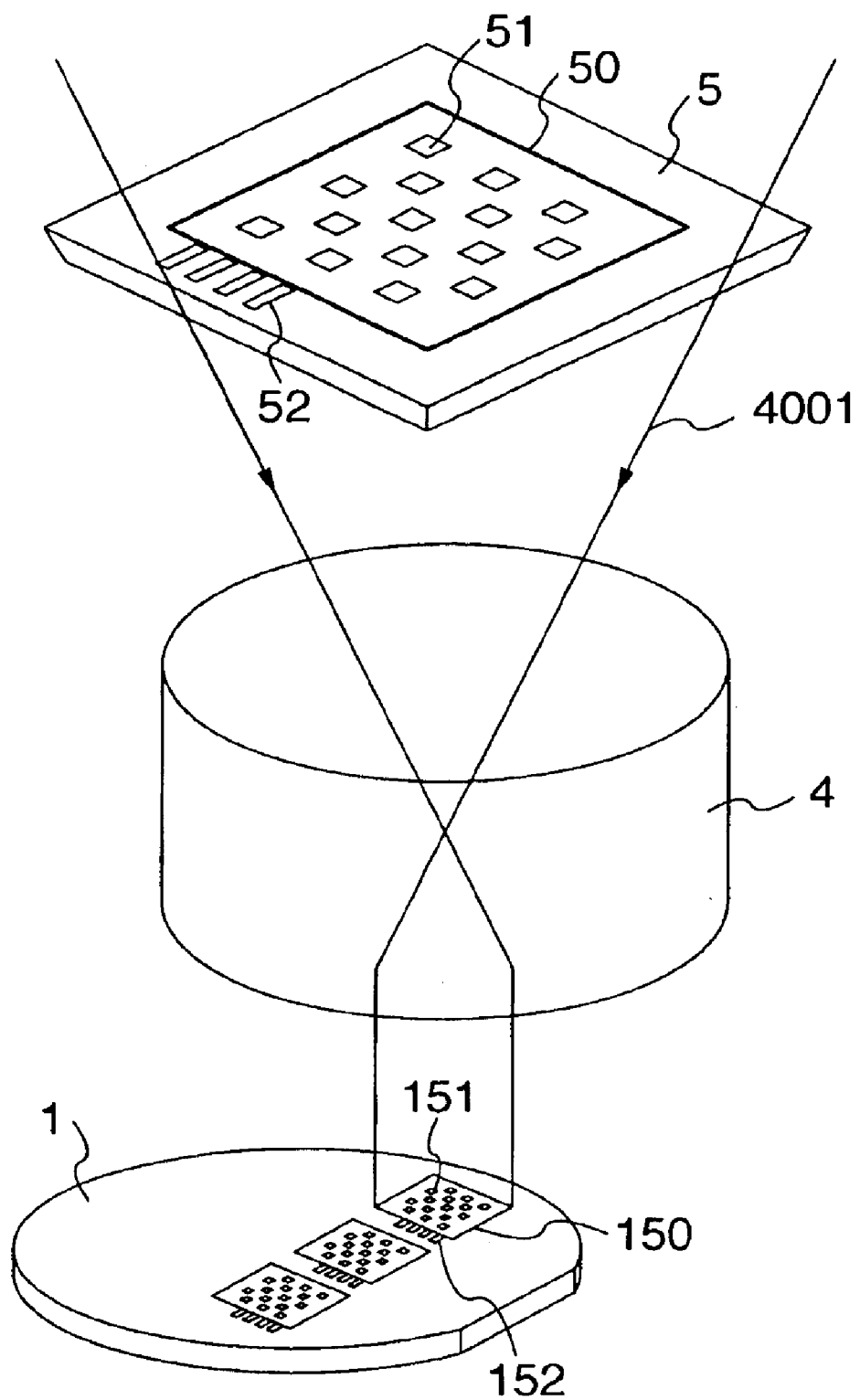
FIG. 19 is a perspective view for explaining an example of the exposure apparatus forming a part of the semiconductor device manufacturing system as the embodiment of the present invention.
Figure 20A:
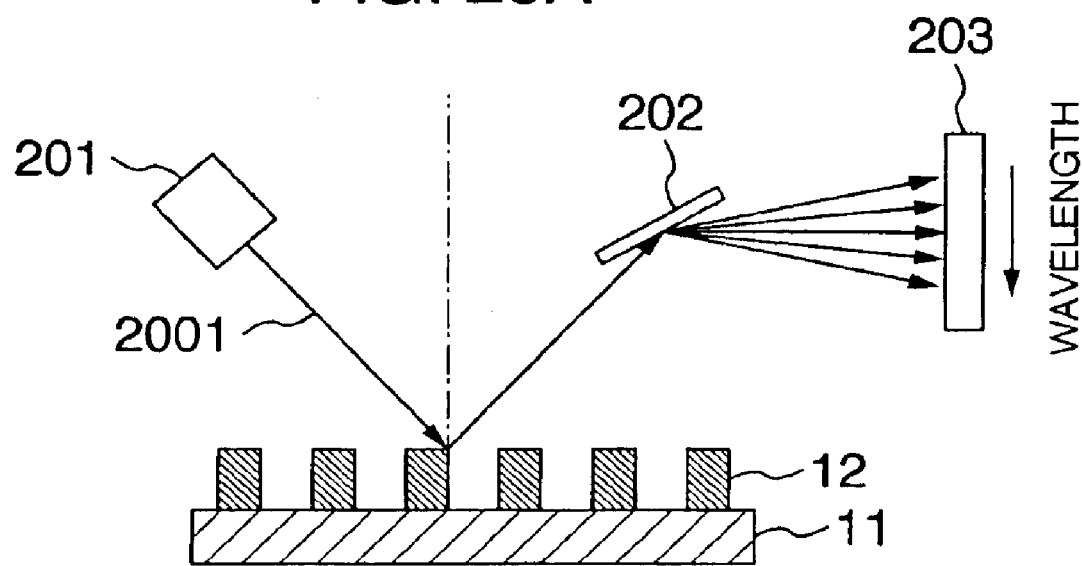
FIGS. 20A and 20B are conceptual views for explaining examples of a scatterometry apparatus forming a part of the semiconductor device manufacturing system as the embodiment of the present invention.
Figure 20B:
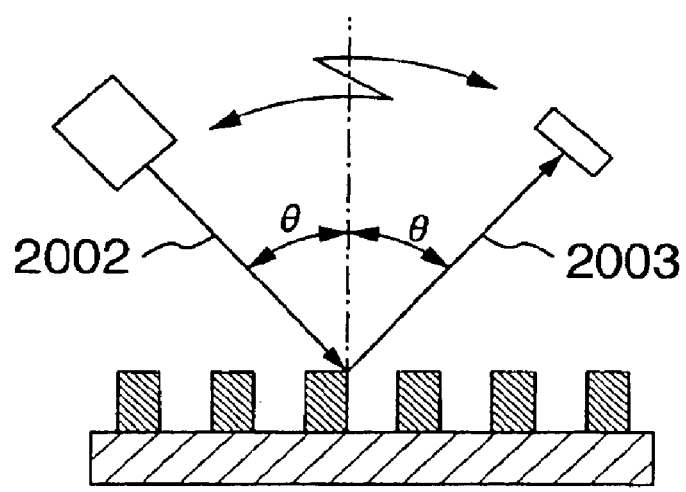
Figure 21:
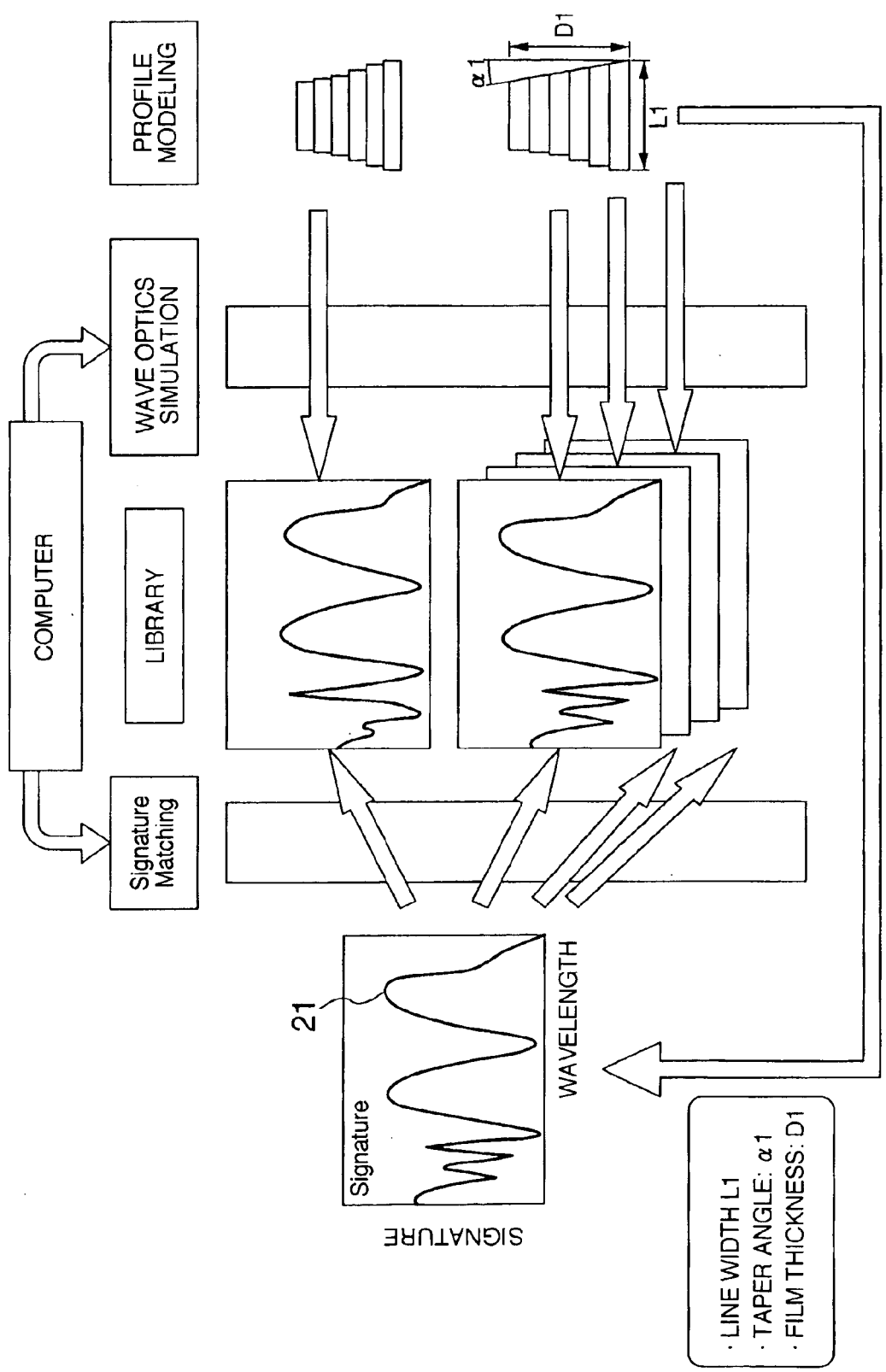
FIG. 21 is a conceptual view for explaining an example of operational principle of the scatterometry apparatus forming a part of the semiconductor device manufacturing system as the embodiment of the present invention.
Figure 22:
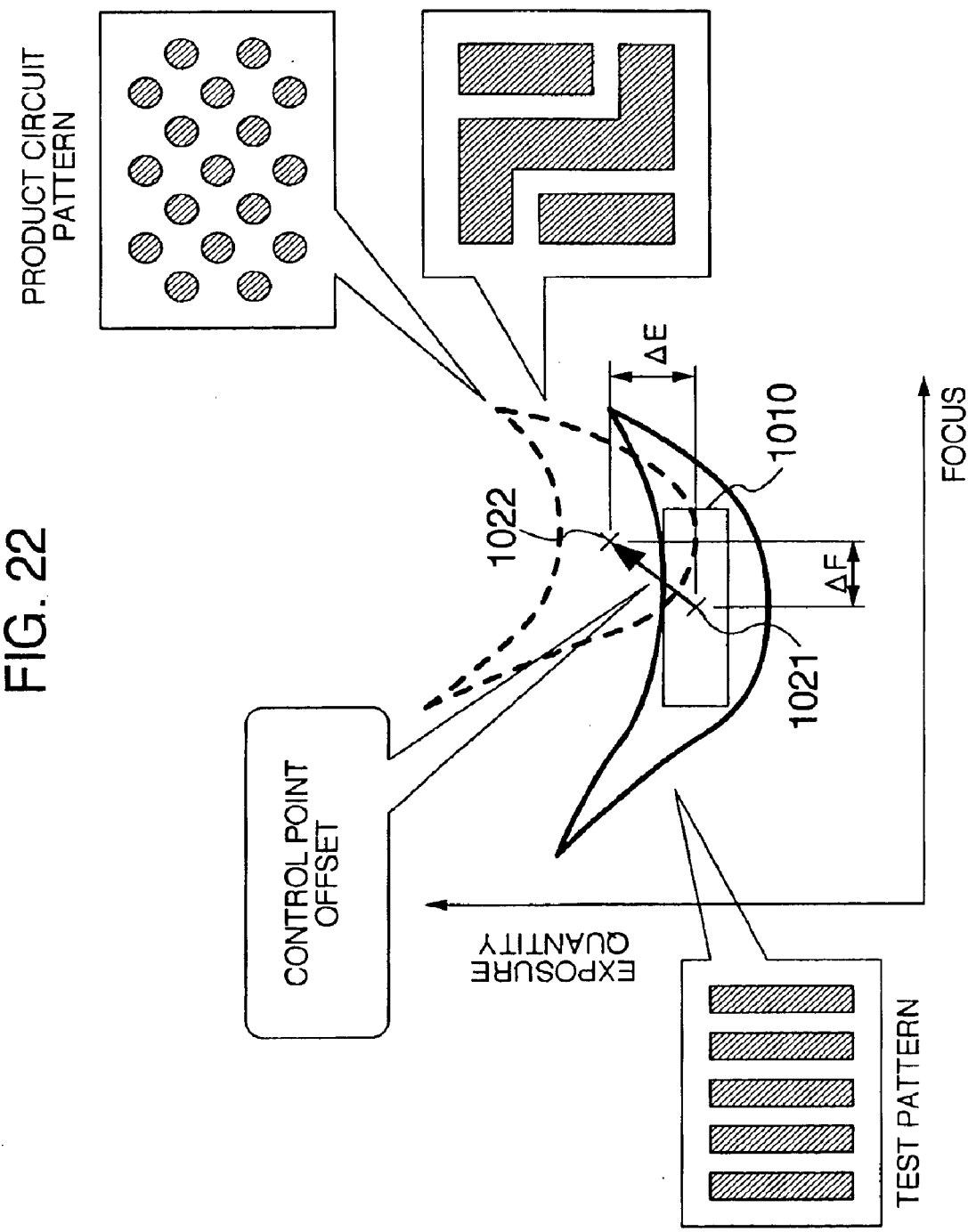
FIG. 22 is a conceptual view for explaining differences between the optimum values of the exposure light quantity and focus of the test and product circuit patterns as one of technical problems to be solved in the present invention.

Explanation will next be made as to a system for manufacturing a semiconductor device in an embodiment of the present invention by referring to FIG. 18.

In steps of manufacturing a semiconductor device, a film is formed on a wafer 1 by a film deposition device 61, the film is planarized by a chemical mechanical polishing (CMP) device 62, and thereafter with use of coating/exposing/developing devices, resist as a photosensitive agent is applied on the wafer, a circuit pattern is exposed with light, and the photosensitive agent is developed. Coating and exposing devices are physically independent devices. However, since these devices can be regarded as a single device, the devices were denoted by coating/exposing/developing devices in FIG. 18. Since there are a plurality of such coating/exposing/developing devices, they are denoted by #1 device 631, #2 device 632, . . . and #n device 63n. In this case, the explanation will be made in the case of using only two devices 631 and 632 in order to simplify the explanation. The wafer 1 is usually one of a plurality of wafers forming one lot, a processing history thereof in each device is sent to a computer 3 via a network 600 and stored in a database of a lot history data memory 31 therein. The lot history includes the numbers of processing devices, the type of the semiconductor device, steps, recipe data such as illumination conditions, and reticle name.

After developing treatment, signal waveforms of the test pattern are measured by a scatterometry apparatus 2 and then sent to a signal waveform processing system 7. The signal waveform processing system 7 feeds corrections of the exposure light quantity and focus at the next time of exposure for the same type, step and device number back to the coating/exposing/developing devices 631 and 632.

After measured by the scatterometry apparatus 2, the wafer 1 is etched by an etching device 64, the resist as a photosensitive agent is removed by a resist removal device 65, and then a film in a next step is again formed by the film deposition device 61. Such a process is repeated to manufacture a semiconductor device.

Explanation will now be made as to the aforementioned signal waveform processing system 7.

Dimensions of widths, pitches and so on and coordinate data of the product circuit and test patterns to be subjected to control of the exposure light quantity and focus are first registered in a reticle data memory unit 711 together with a reticle name. Such data may be input manually or from another computer (not shown). When one of parts of the same reticle having the strictest margins of the exposure light quantity and focus is selected as the product circuit pattern to be registered. Its control accuracy can be increased. Further, illumination conditions information at the time of exposure is acquired from the lot history data memory 31 of the host computer 3, and stored in an illumination conditions memory unit 712. Wave aberration data is measured by the aforementioned method and previously registered in a wave aberration data memory unit 713 for each of the exposure apparatuses and for each coordinate on the reticle.

At the timing when these data were newly registered, a control unit 700 issues an instruction to a test-product-circuit-pattern optimum-value deviation calculation unit 701 to calculate deviations from the optimum values of the test and product circuit patterns. The test-product-circuit-pattern optimum-value deviation calculation unit 701 acquires the dimensions and coordinate data of the product circuit and test patterns from the reticle data memory unit 711, illumination conditions from the illumination conditions memory unit 712, and wave aberration data corresponding to the coordinates of the target product circuit and test patterns from the wave aberration data memory unit 713; and calculates deviations from the optimum values of the exposure light quantity and focus of the test and product circuit patterns by the aforementioned method. The calculated deviations are stored in a test-pattern/product-circuit-pattern optimum-value deviation memory unit 714 together with information about the type of the semiconductor device, step and exposure apparatus numbers under control of the control unit 700.

Library signal waveforms associated with the focus exposure matrix (FEM) are found, as already mentioned above, by simulation by conducting exposure experiments over the FEM wafer 110 with use of an exposure apparatus and modeling the profiles of the respective patterns. The found waveforms are stored in an FEM-linked library signal waveform memory unit 715 through an input device (not shown). In a signal waveform library of a conventional scatterometry apparatus, the signal waveforms have not been associated with the FEM and been parameters for defining pattern sectional profiles. For example, the signal waveforms have been associated only with line width, taper angle, film thickness, etc.

Library signal waveforms associated with the FEM can be obtained without conducting exposure experiments. For example, such development simulation as described in Inside PROLITH, written by Chris. A. Mac and translated by Toshiharu Matsuzawa, Lithotech Japan, 1997, pp. 105–114 is carried out after transfer image simulation, a pattern profile after the development is obtained and library signal waveforms can be calculated on the basis of the obtained pattern profile. In this case, a difference in the signal waveform between the different numbered exposure apparatuses depends on the wave aberration. The wave aberration of the corresponding exposure apparatus stored in the wave aberration data memory unit 713 is used during the transfer image simulation, a signal waveform library for each exposure apparatus can be obtained without any experiments.

Explanation will next be made as to how to process the signal waveforms of the test pattern actually measured by the scatterometry apparatus 2. The measured signal waveforms are sent to a measured/library waveform matching unit 702 via the control unit 700. The measured/library waveform matching unit 702 searches the FEM-linked library signal waveform memory unit 715 for FEM library signal waveforms with use of the type, step and exposure apparatus corresponding to the measured signal waveforms as keywords, calculates a difference ΔS found in the equation (1) for each of the signal waveforms of the FEM, selects one of the signal waveforms having the minimum difference ΔS from the FEM library signal waveforms, and finds deviations from the optimum values of the exposure light quantity and focus corresponding to the selected signal waveform. An exposure-apparatus-correction calculating unit 704 searches the test-pattern/product-circuit-pattern optimum-value deviation memory unit 714 for corresponding optimum value deviations with use of the type, step and exposure apparatus corresponding to the measured signal waveforms as keywords, corrects the deviations from the optimum values of the test pattern on the basis of the searched deviations, calculates corrections of the exposure light quantity and focus for the product circuit pattern, and feeds the calculated corrections back to the corresponding exposure apparatuses via the control unit 700 and network 600.

Figure 23:
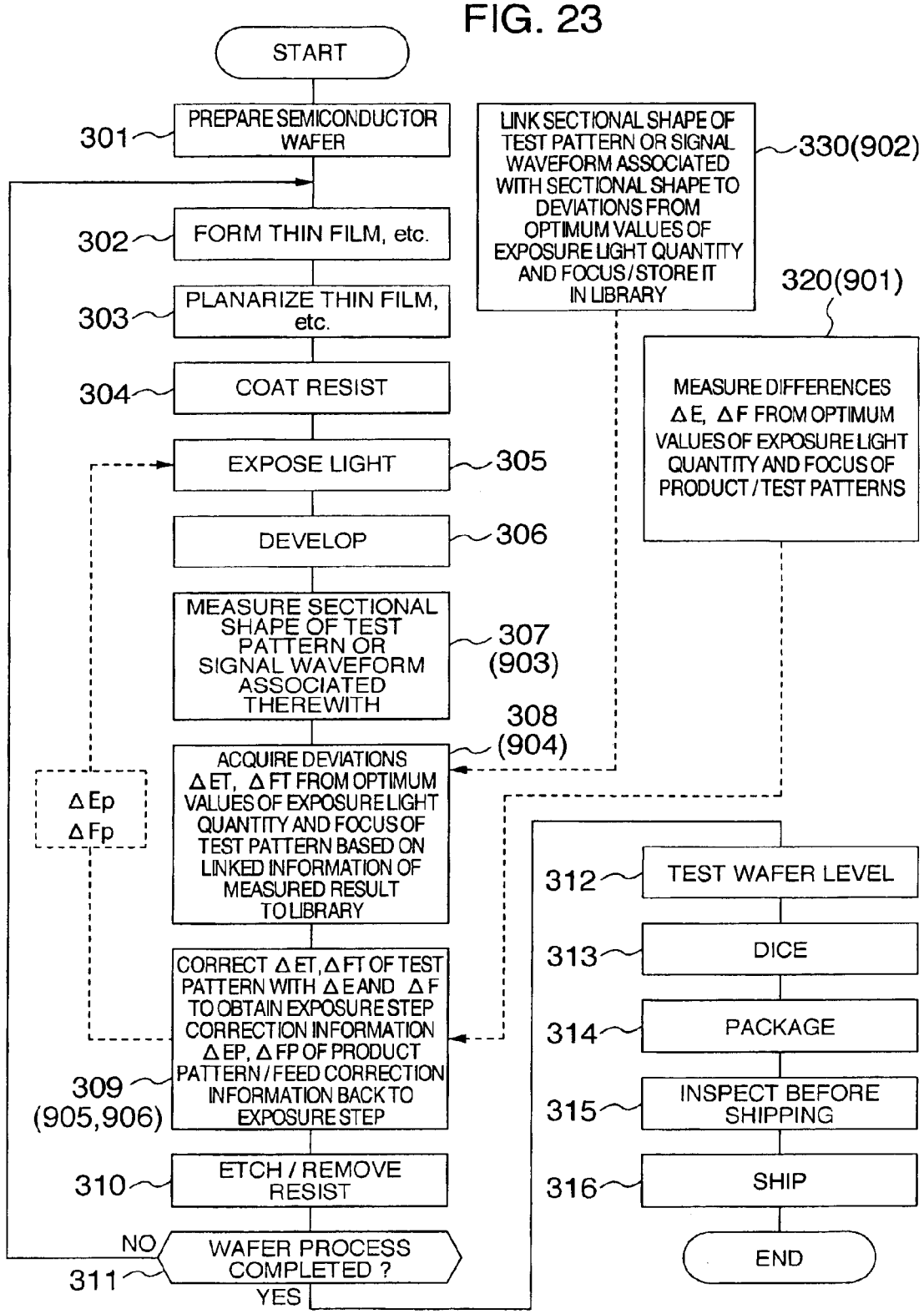
FIG. 23 is a flowchart showing an example of operation in the method for manufacturing a semiconductor device as the embodiment of the present invention.

FIG. 23 shows a flowchart of an exemplary general flow of operations of the step of manufacturing a semiconductor device used in the above semiconductor device manufacturing system.

More specifically, a wafer 1 is prepared in steps including steps of slicing and polishing an ingot of semiconductor single crystal (step 301), differences ΔE and ΔF from the optimum values of the exposure light quantity and focus of the product circuit and test patterns are previously measured (step 320), and the sectional shapes of the test pattern or the signal waveforms associated with the sectional shapes are previously stored in the library as associated with the deviations from the optimum values of the exposure light quantity and focus (step 330).

After a thin film or the like is formed on the wafer 1 (step 302), the film is planarized (step 303), the wafer is coated with resist (step 304), exposed by the exposure apparatus (step 305), and developed (step 306).

In the present embodiment, signal waveforms of the test pattern on the developed wafer 1 are measured by the scatterometry apparatus 2 (step 307), and its measured result is collated with the library signal waveforms formed in the step 330 to obtain deviations ΔEt and ΔFt from the optimum values of the exposure light quantity and focus relating to the test pattern (step 308).

Further, the ΔEt and ΔFt obtained in the step 308 are corrected with use of known ΔE and ΔF to obtain deviations ΔEp and ΔFp (exposure step correction information) from the optimum values of the exposure light quantity and focus relating to the product pattern, the obtained deviations ΔEp and ΔFp are fed back to the exposure step 305 to reflect it on the subsequent exposure steps (step 309).

Thereafter, the wafer is etched with use of the resist as a mask to form a product pattern and remove the resist (step 310), and it is judged whether or not the wafer process was completed (step 311). If the wafer process is not completed, then the step 302 and subsequent steps are repeated.

If the wafer process is completed, then the functions of the semiconductor devices are tested at the wafer level with— use of a wafer probe or—the like to select acceptable ones of the devices (step 312). Thereafter, the wafer 1 is diced into individual semiconductor devices (step 313). Only acceptable semiconductor devices are packaged by sealing them and so on (step 314), subjected to an inspection prior to shipping such as a burn-in test (step 315), and only good semiconductor devices are shipped (step 316).

As has been explained above, in the case of the present embodiment, deviations from the optimum values of the exposure conditions in the exposure step 305 in the lithography steps 302 to 310 are individually detected for each exposure light quantity and focus by measuring the test pattern by scatterometry and correcting its product pattern, and then fed back to the subsequent exposure processings. Thus, since exposure conditions such as the exposure light quantity and focus are always kept in a range close to the optimum values, the yield of the semiconductor device can be improved.

The invention made by the inventor of the present application has been explained in detail in connection with the embodiments. However, it goes without saying that the present invention is not limited to the specific embodiments but may be modified in various ways without departing from its subject matter or gist.

The effects of typical ones of the inventions disclosed in the present application are summarized as follows.

(1) Since deviations from the optimum values of the exposure light quantity and focus of the product circuit pattern can be found from measured data on the test pattern, the exposure light quantity and focus of a microstructured or fine device having a narrow margin can be controlled at the same time and independently of each other and its yield can be increased.

(2) One of the product circuit patterns having the narrowest margin is selected. Thus, since the optimum values to the pattern most effective for the highest yield are found, its yield can have a value higher than the case where another product circuit pattern in the other regions is employed.

(3) Since the scatterometry of light irradiation can eliminate the need for evacuating operation requiring a lot of time unlike the case of using SEM such as use of signal waveforms, a throughput for acquiring the signal waveforms can be increased. Further, unlike the SEM case where the sectional profile of a pattern to be measured by electron beam irradiation may be varied, the light irradiation case can involve substantially no damage caused by such measurement.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for manufacturing a semiconductor device, comprising the steps of:

forming a thin film on a substrate to be subjected to light exposure;

applying resist on the substrate;

exposing a product circuit pattern on an exposure original plate on the substrate having said resist applied thereon;

developing the exposed resist to form a pattern of the resist, and etching said substrate with use of the developed resist pattern as a mask to form a pattern of said thin film, wherein said light exposure step further includes:

a first step of previously acquiring differences in the quantity of exposure light and focus between the product circuit pattern within said exposure original plate and a test pattern;

a second step of linking a sectional shape of the test pattern or a signal waveform associated with the sectional shape to deviations from the optimum values of the exposure light quantity and focus and storing them as linked information;

a third step of measuring the sectional shape of said test pattern formed on said substrate through said light exposure step or the signal waveform associated with the sectional shape;

a fourth step of calculating deviations from optimum values of the exposure light quantity and focus of said test pattern in said light exposure step on the basis of said sectional shape of said test pattern or said signal waveform associated with the sectional shape measured in said third step and on the basis of said linked information of said second step;

a fifth step of calculating deviations from the optimum values of the exposure light quantity and focus of said product circuit pattern on the basis of said deviations from the optimum values of the exposure light quantity and focus relating to said test pattern obtained in said fourth step and on the basis of said differences in the optimum values of the exposure light quantity and focus between said product circuit pattern and said test pattern obtained in said first step; and a sixth step of feeding said deviations from the optimum values of the exposure light quantity and focus of said product circuit pattern calculated in said fifth step back to said light exposure step.

2. The method as set forth in claim 1, wherein said product circuit pattern has one of the product circuit patterns having strictest margins of the exposure light quantity and focus to dimensional specifications within said exposure original plate.

3. The method as set forth in claim 1, wherein the signal waveform in the third step of said exposure step is a change in the reflection intensity of the test pattern with respect to the wavelength or incident angle of illumination light.

4. The method as set forth in claim 1, wherein, in the first step of said exposure step, acquiring said differences in the optimum values of the exposure light quantity and focus between said product circuit pattern and said test pattern within said exposure original plate, by using dimensions of said product circuit and test patterns, illumination conditions at the time of exposure, and the wave aberration of the exposure apparatus associated with the positions of said product circuit and test patterns within said exposure original plate.

5. The method as set forth in claim 1, wherein, in the second step of said exposure step, the sectional shape of said test pattern and the signal waveform thereof are calculated with use of the dimensions of said test pattern, the illumination conditions at the time of exposure, and the wave aberration of the exposure apparatus associated with the position of said test pattern within said exposure original plate to link said signal waveform associated with said sectional shape of said test pattern or said signal waveform associated with said sectional shape to said deviations from the optimum values of the exposure light quantity and focus and to store it as said linked information.

6. The method as set forth in claim 1, wherein the second step of said exposure step further include the steps of:

preparing a focus exposure matrix (FEM) wafer having a plurality of said test patterns formed thereon by performing light exposing (shotting) operation while stepwise changing the exposure light quantity and focus;

measuring a sectional profile of each of said plurality of test patterns (shots) formed on said FEM wafer;

generating a sectional profile model from said sectional profiles; and calculating the signal waveform with use of said sectional profile model and with a pitch of the exposure light quantity and focus smaller than a spacing between said plurality of test patterns formed on said FEM wafer.

7. A method for manufacturing a semiconductor device, comprising the steps of:

forming a thin film on an exposure substrate;

applying resist on the exposure substrate;

exposing a circuit product pattern on an exposure original plate on said exposure substrate having said resist applied thereon;

developing the exposed resist to form a pattern of the resist; and etching said exposure substrate with use of the developed resist pattern as a mask to form a pattern of said thin film, wherein said exposing step further includes:

a first step of linking the sectional shape of said resist pattern or a signal waveform associated with said sectional shape to deviations from the optimum values of the exposure light quantity and focus, and storing it as linked information;

a second step of measuring a sectional shape of said product circuit pattern formed on said exposure substrate through said exposure step or a signal waveform associated with said sectional shape;

a third step of calculating deviations from the optimum values of the exposure light quantity and focus of said product circuit pattern in said exposure step on the basis of said sectional shape of said product circuit pattern or said signal waveform associated with said sectional shape measured in said second step and on the basis of said linked information in said first step; and a fourth step of feeding said deviations from the optimum values of the exposure light quantity and focus of said product circuit pattern calculated in said third step back to said exposure step.

8. The method as set forth in claim 7, wherein the signal waveform of the product circuit pattern in the second step of said exposing step is a signal waveform obtained by measuring the product circuit pattern with use of a scatterometry apparatus or a signal waveform obtained by measuring said product circuit pattern with use of an atomic force microscope (AFM).

9. The method as set forth in claim 7, wherein said signal waveform indicates a change in the reflection intensity of the product circuit pattern to the wavelength or incident angle of illumination light.

10. A method for manufacturing a semiconductor device, comprising the steps of:

forming a thin film on an exposure substrate;

applying resist on said exposure substrate;

exposing a product circuit pattern on an exposure original plate onto the substrate having said resist applied thereon;

developing the exposed resist to form a pattern of the resist; and etching said exposure substrate with use of the pattern of the developed resist as a mask to form a pattern of said thin film, wherein said exposing step further includes:

a first step of storing data for linking sectional shape information about a product circuit pattern to sectional shape information about a test pattern;

a second step of measuring the test pattern;

a third step of calculating deviations from the optimum values of exposure conditions of said product circuit pattern in said exposing step on the basis of the sectional shape information on said test pattern measured in said second step and the data stored in said first step; and a fourth step of feeding said deviations from the optimum values of the exposure conditions of said product circuit pattern calculated in said third step back to said exposing step.

11. The method as set forth in claim 10, wherein said test pattern is formed outside of a region of said product circuit pattern on said exposure substrate.

12. The method as set forth in claim 10, wherein said test pattern is made up of lines and spaces.

13. The method as set forth in claim 10, wherein, in the second step of said exposing step, said test pattern is optically measured.

14. The method as set forth in claim 10, wherein, in the second step of said exposing step, said test pattern is measured with use of a scatterometry apparatus.

15. The method as set forth in claim 10, wherein the optimum values of the exposure conditions of said product circuit pattern include the optimum values of the exposure light quantity and focus.

16. A semiconductor device manufacturing system comprising:

an exposure apparatus for exposing a product circuit pattern of an exposure original plate on the substrate;

a scatterometry apparatus having a light source for irradiating light on a subject to be examined and a sensor for detecting light passed through said subject as a signal waveform, for measuring said signal waveform according to the surface shape of said subject;

a history memory unit for storing a history of said exposure apparatus used in manufacturing of said substrate, illumination conditions and said exposure original plate;

an original plate data memory unit for storing dimensions of the product circuit pattern of said exposure original plate, dimensions of a test pattern, coordinates of said product circuit pattern and coordinates of said test pattern;

an illumination conditions memory unit for storing illumination conditions for said exposure apparatus;

a wave aberration data memory unit for storing wave aberration data for said exposure apparatus and each of the product circuit pattern and test pattern coordinates;

a pattern optimum value deviation calculation unit for calculating deviations from optimum values of the exposure light quantity and focus of said test pattern and said product circuit pattern from said illumination conditions, said dimensions of said product circuit pattern and test pattern, and the wave aberration for said coordinates;

a pattern optimum value deviation memory unit for storing said optimum value deviations;

an FEM-linked library signal waveform memory unit for storing deviations from the optimum values of the exposure light quantity and focus and a signal waveform associated with a sectional shape of said test pattern as linked to said deviations;

a waveform matching unit for calculating deviations from the optimum values of the exposure light quantity and focus of said test pattern by extracting most matched one of said signal waveforms stored in said FEM-linked library signal waveform memory unit with respect to said test pattern signal waveform of said subtrate actually measured by said scatterometry apparatus;

a correction calculation unit for calculating a correction of the exposure apparatus to said product circuit pattern from said deviations from the optimum values of the exposure light quantity and focus of said test pattern calculated by said waveform matching unit and from said optimum value deviations of said test pattern and said product circuit pattern stored in said pattern optimum value deviation memory unit; and a control unit for controlling said each unit, said scatterometry apparatus and data input/output between said exposure apparatus.

* * * * *